United States Patent [19]

Inculet et al.

[11] Patent Number: 4,808,849
[45] Date of Patent: Feb. 28, 1989

[54] PHYLLOSILICATE ELECTRETS AND A METHOD FOR THEIR MANUFACTURE

[75] Inventors: Ion I. Inculet; Robert M. Quigley, both of Ontario, Canada

[73] Assignee: Canadian Patents and Development Limited/Societe Canadienne des Brevets et D'Exploitation Limitee, Ontario, Canada

[21] Appl. No.: 151,758

[22] Filed: Feb. 3, 1988

[30] Foreign Application Priority Data

Feb. 3, 1987 [CA] Canada .................................. 528911

[51] Int. Cl.⁴ .......................... G11C 13/02; H01S 4/00; B03C 3/02
[52] U.S. Cl. ...................................... 307/400; 264/22; 29/592 E; 55/155
[58] Field of Search ................. 307/400; 381/116, 174, 381/191; 367/170, 191; 29/592 E; 55/155, DIG. 39; 264/22, 24, 26, 27

[56] References Cited

U.S. PATENT DOCUMENTS

| | | | |
|---|---|---|---|
| 3,458,713 | 7/1969 | Perlman et al. | 307/400 |
| 3,705,312 | 12/1972 | Sessier et al. | 307/400 |
| 4,149,095 | 4/1979 | Poirier et al. | 307/400 |
| 4,185,972 | 1/1980 | Nitta et al. | 55/155 |
| 4,246,448 | 1/1981 | Tam et al. | 307/400 X |
| 4,250,415 | 2/1981 | Lewiner et al. | 307/400 |
| 4,291,245 | 9/1981 | Nowlin et al. | 307/400 |
| 4,308,223 | 12/1981 | Stern | 264/22 |
| 4,440,591 | 4/1984 | Pook | 307/400 X |
| 4,441,038 | 4/1984 | Tanaka et al. | 307/400 |
| 4,443,711 | 4/1984 | Tanaka et al. | 307/400 |
| 4,455,494 | 6/1984 | Tanaka et al. | 307/400 |
| 4,732,717 | 3/1988 | Yanagida et al. | 264/22 |

*Primary Examiner*—William M. Shoop, Jr.
*Assistant Examiner*—Sharon D. Logan
*Attorney, Agent, or Firm*—Nixon & Vanderhye

[57] ABSTRACT

An electret comprising an inherently charged material is provided. The material comprises phyllosilicate minerals and has external neutralizing ions removed therefrom or external ions added thereto. The electret is manufactured by either removing external ions from or adding external ions to a surface thereof. In a preferred embodiment, the electret is fabricated by placing the material between a pair of electrodes and immersing the material and electrodes in high-voltage insulating medium. A dc potential is then applied across the electrodes to create an electric field across the material. The duration of application of the dc potential is sufficient to provide a large surface charge on the material. The material is then separated from the electrodes while it is still immersed in the insulating medium. The separated material is then removed from the medium to obtain a substantially permanently charged electret.

19 Claims, 3 Drawing Sheets

PHYLLOSILICATE ELECTRETS AND A METHOD FOR THEIR MANUFACTURE

This invention relates to electrets and to a method of manufacturing electrets.

Electrets are analagous to magnets, however, whereas a magnet maintains a permanent magnetic field, an electret maintains a permanent electric field.

The industrial applications for electrets include electrostatic surgical masks in operating rooms and transducers in telephone headsets.

It is known to make electrets from carnuba wax. This wax is melted and placed between two plates of a capacitor. The wax molecule dipoles become oriented with their negative ends towards the positive plate and their positive ends towards the negative plate. The wax is then allowed to solidify and is subsequently removed from the capacitor. An electret with permanent polarization is thereby obtained.

The latest technology uses plastic materials to form electrets. The plastic is simultaneously heated and subjected to an electric field to form an electret. The surface charges can be obtained by both application of an electric field and corona injection.

The limitation of the above conventional electret materials is that the surface charge is relatively low. Also, conventional electrodes are generally made from man-made materials and therefore are expensive.

It is an object of the present invention to obviate or mitigate the above-mentioned disadvantages.

Accordingly, the invention provides an electret comprising an inherently charged material. This material comprises phyllosilicate minerals and has had external neutralizing ions removed therefrom or added thereto.

In another one of its aspects, the invention provides a method of fabricating an electret involving the removal of external neutralizing ions from a surface thereof or the addition of external ions onto a surface thereof.

This method preferably includes the steps of placing a material comprising phyllosilicate minerals between a pair of electrodes and immersing the material and the electrodes in an electrically insulating medium. A dc potential is then applied across the electrodes to create an electric field across the material. The duration of application of the dc potential is sufficient to provide a large surface charge on the material. The material is subsequently separated from the electrodes while it is still immersed in the oil and an electric field is still applied across the material. The separated material is then removed from the medium to obtain substantially permanently charged electrets.

It has been discovered that whereas previously used materials had to be polarized to be made into electrets, some phyllosilicate materials already have large surface charge densities which under normal circumstances are neutralized by external environmental ions of opposite polarity. The method of the present invention removes the external ions to provide an electret of relatively large surface charge density. Also, the use of phyllosilicate minerals allows the electret to be divided into layers along its natural basal cleavage planes in situ to provide thin sheets or flakes of electret material.

It has also been found that phyllosilicate materials cannot be made into electrets by the conventional method of polarizing a material between electrodes in ambient air at any temperature, probably due to their inherently large surface charges. It has now been discovered and forms part of the present invention that electrets can be formed from this material if the electrodes and phyllosilicate materials are immersed in an electrically insulating medium.

It is believed that the reason that phyllosilicates cannot be made into electrets in air using two electrodes is that when the layers of electret material are separated, the very high potential between the separated surfaces ionizes the air between the surfaces and discharges the surface charges through the conductive ionized gas. By separating the layers of electret material in an electrically insulating medium, the surface charges are not discharged. Once the distance between the two separated surfaces is sufficiently large, the potential difference is no longer sufficient to ionize the air and the charges which were developed on the mica surfaces are permanently attached, generating very strong electric fields.

The materials suitable for use in the present invention are those containing inherently charged phyllosilicate materials. The origins of the phyllosilicate materials preferably include igneous, metamorphic, sedimentary, weathering and artificially synthesized origins. The phyllosilicate minerals are preferably micas, for example muscovite, biotite, phlogopite, and lepidolite; vermiculite; chlorites; brittle micas; kaolinite; nacrite; dickite; serpentine minerals; or smectite clay minerals. Rocks containing phyllosilicates can also be used, preferably those having foliated, gneissic and schistose structures, or fabrics, or slates and phyllites with major cleavage planes particularly those rocks which can be separated along their natural cleavage planes into thin sheets. In addition, man-made materials fabricated with clay minerals such as paper products and ceramic tiles can be used.

The thermally insulating material is preferably high voltage transfer oil or high voltage insulating gas such as $SF_6$.

In the method of the invention, preferably a dc potential is applied between the electrodes for a minimum of 10 minutes and an electric field in the order of 200,000 up to 1,000,000 volts per centimetre is established across the material. An electric field higher than 1,000,000 volts should be avoided as breakdown of the mica sheet may occur.

It has been found that surface potentials of a 100 micrometre thick mica electrode manufactured with the process of the present invention reached 2,500 volts.

A preferred embodiment of the invention will now be described, by way of illustration only, with reference to the following drawings in which.

Figure 1:
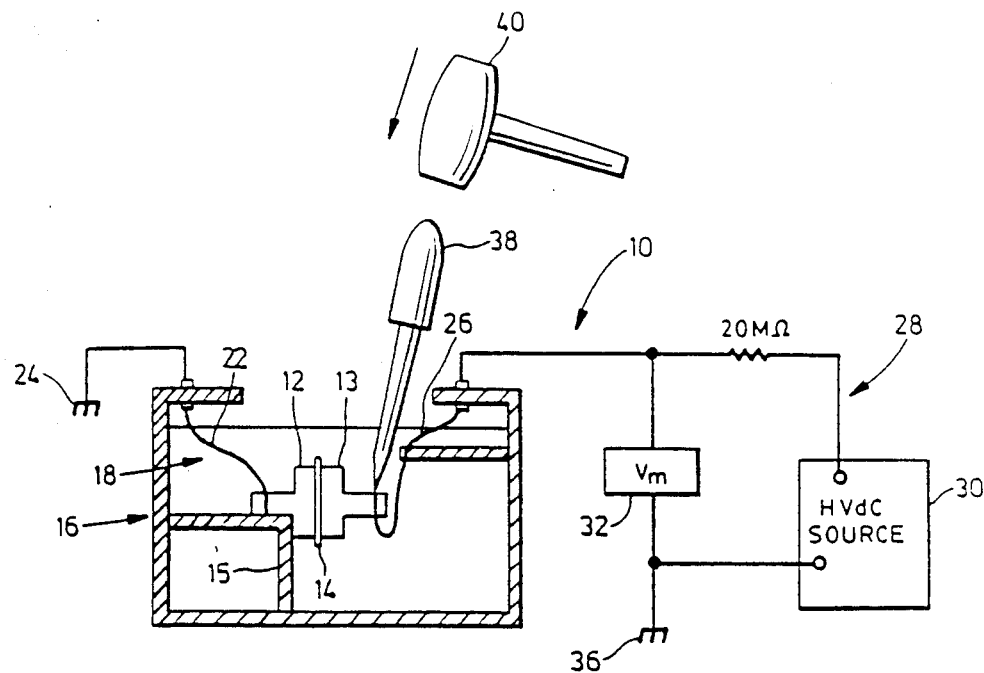
FIG. 1 is a schematic representation of an apparatus for preparing an electret according to the invention.

As can be seen in FIG. 1, apparatus 10 for preparing an electret of the preferred embodiment includes a pair of electrodes 12, 13 with a sheet of mica 14 disposed therebetween. The electrodes 12, 13 are disposed in a tank 16 filled with high voltage transformer oil 18 and one of the electrodes 12 rests on a support 15 in the tank. This electrode 12 is connected by a wire 22 to ground 24. The other electrode 13 is connected by a wire 26 to a power source assembly 28 consisting of a high voltage dc source 30 with a high voltage probe and digital multimeter 32 and a 20 Mega ohm resistor 34 connected thereto in parallel with each other. The probe and multimeter 32 is also connected to ground 36.

A pick 38 is shown disposed above the electrode 13 and a hammer 40 is disposed above the pick.

tion time but is saturated when the application time is greater than 12 minutes.

The electrets formed in this manner were separated in the oil into layers along their natural cleavage planes. The layers were found to have high surface potentials and were therefore suitable for use as electrets.

TABLE 1

SPECIFIC DATA AND EXPERIMENTAL RESULTS OF THE ELECTRETS FABRICATED BY THE BREAKING METHOD

| Sample # | #a$^1$ | #a | #c$_3$ | #d$_1$ | #d$_2$ | #e$_2$ | #e$_3$ | #e$^1$ | #e" | #f | #g | Remark |
|---|---|---|---|---|---|---|---|---|---|---|---|---|
| $t_m$ [um] | 30.5 | 52.1 | 66.2 | 76.2 | 76.2 | 96.5 | 96.5 | 100.3 | 101.6 | 112.0 | 120 | Mica thickness. |
| $E_a$ [KV/cm] | 1000 | 1000 | 1000 | 1000 | 1000 | 1000 | 500 | 250 | 250 | 1000 | 1000 | The electric field between electrodes. |
| $V_a$ [KV] | 3.05 | 5.21 | 6.62 | 7.63 | 7.66 | 9.66 | 4.83 | 2.50 | 2.54 | 11.20 | 12.0 | Applied voltage. |
| $V_s$ [KV] | 1.50 | (−2.30) | 3.30 | (−4.00) | 3.30 | 3.90 | 2.46 | (−1.15) | 1.15 | 6.30 | 6.90 | Measured surface potential of mica electret. |
| $V_s/V_a$ | 0.49 | 0.44 | 0.50 | 0.53 | 0.43 | 0.41 | 0.51 | 0.45 | 0.45 | 0.56 | 0.58 | *[Calculated Ratio] NOTE = "Fairly Constant". |
| $t_a$ (minutes) | 60 | 12 | 60 | 60 | 60 | 30 | 30 | 30 | 30 | 60 | 60 | Duration of voltage application at electrode 13. |

The operation of the apparatus is as follows. A sheet of mica 14 is glued between the electrodes 12, 13 and the electrodes are immersed in the tank 16 of oil 18. The high voltage source 30 applies the dc potential to the electrode 13 to generate an electric field inside the mica 14. After 10 minutes or longer, the electrode 14 is knocked off using the pick 38 and hammer 40. The glued electrode 13 removes with it a layer of mica separated along its natural basal cleavage plane. The high voltage source 30 is then shut off and the layers of mica 14 are removed from the oil 18. These mica layers 14 are then mica electrets.

The electrets of the present invention can be used between layers of cloth to form a surgical mask or between two screens to form an air filter. These electrets can also be used as electrical transducers in microphones.

The invention will be further described, by way of illustration only, with reference to the following example.

EXAMPLE

The apparatus is set up as shown in FIG. 1. The process was carried out as described in the preferred embodiment using the parameters reported below in Table 1.

Figure 2:
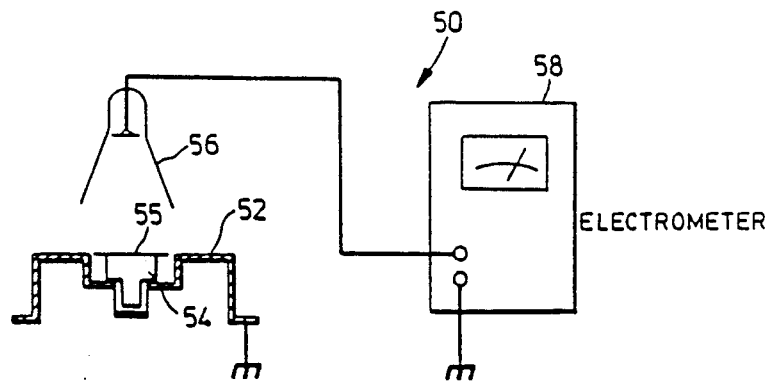
FIG. 2 is a schematic representation of an apparatus for measuring the surface potential of an electret.

The surface potential measurements given in this table were determined using the apparatus shown in FIG. 2.

As can be seen in this Figure, the apparatus 50 comprises a grounded retainer 52 to hold an electrode 54 carrying the electret 55 in an upright position. An electrostatic detection head 56 is located above the retainer 52 and is connected to an electrometer 58. The electrometer 58 provides the surface potential reading.

Figure 3:
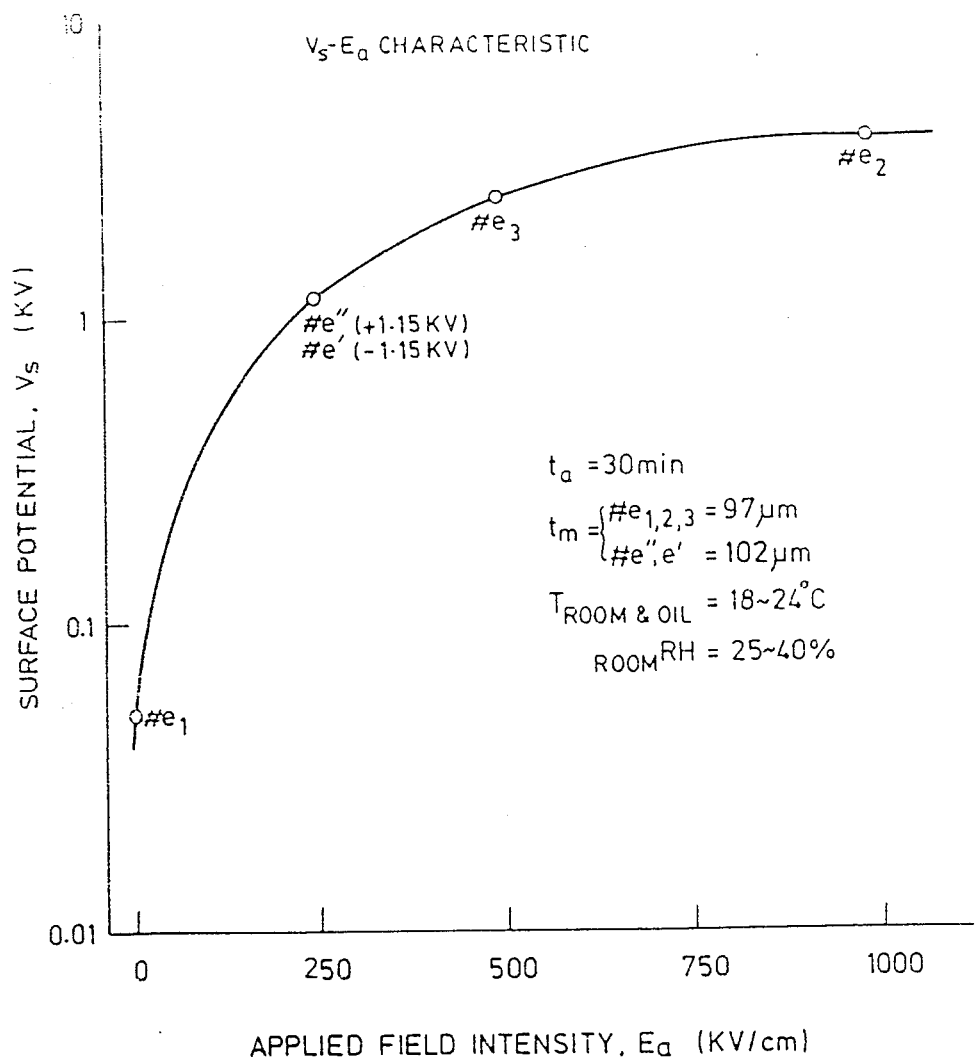
FIG. 3 is a graph of the electret surface potential versus applied field during manufacture.
Figure 4:
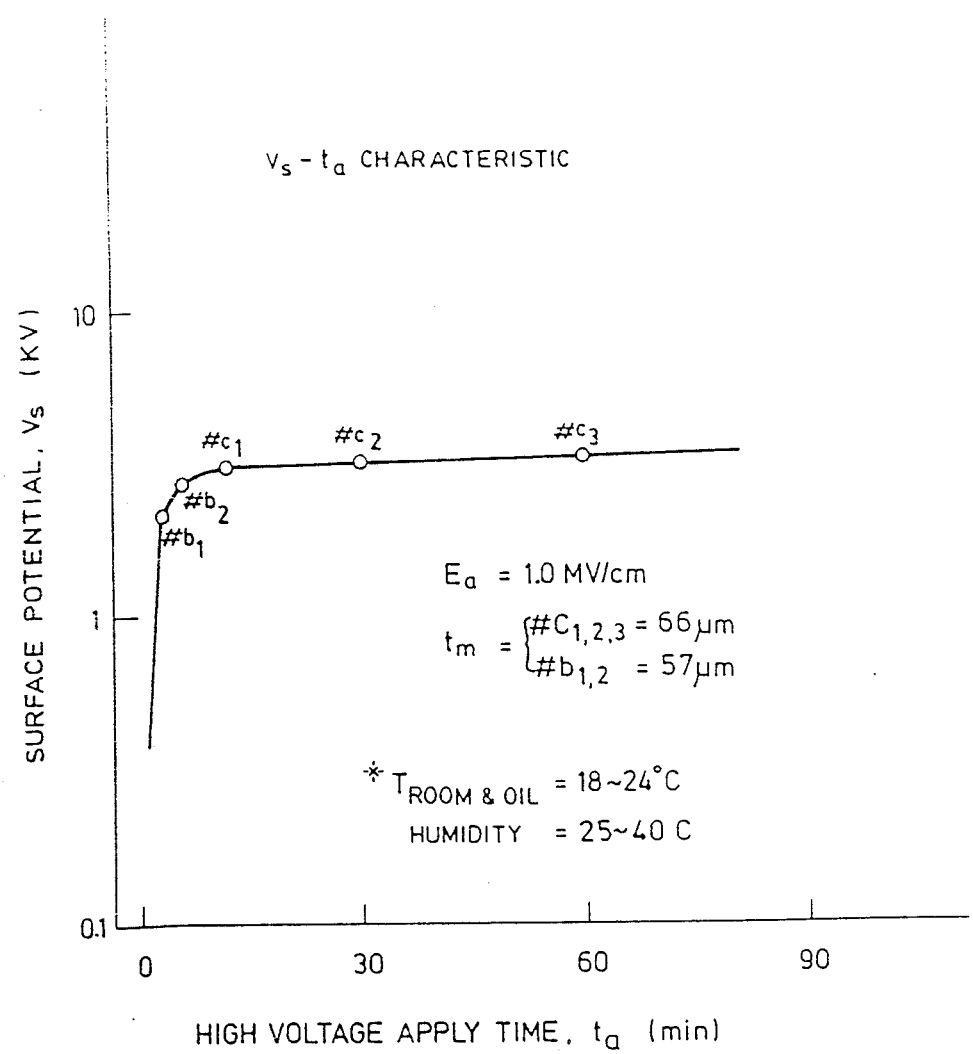
FIG. 4 is a graph of electret surface potential versus electric field application time.

The results of the experiment are shown graphically in FIGS. 3 & 4. FIG. 3 is a graph of the electret surface potential versus applied electric field during manufacture. This graph shows that the surface potential increases rapidly as the applied electric field is increased but is saturated over an applied field of 750,000 V/cm.

FIG. 4 shows the effect of application time on surface potential. The surface potential increases with application time but is saturated when the application time is greater than 12 minutes.

We claim:

1. An electret comprising an inherently charged material comprising phyllosilicate minerals, said material having at least one modified surface, said surface having external neutralizing ions removed therefrom or added thereto.

2. The electret of claim 1 wherein said minerals are minerals of igneous, metamorphic, sedimentary, weathering, and artificially synthesized origins.

3. The electret of claim 2 wherein said minerals are micas selected from muscovite, biotite, phlogopite, and lepidolite; vermiculite; chlorites; brittle micas; kaolinite; nacrite; dickite; serpentine minerals; and smectite clay minerals.

4. The electret of claim 2 wherein said material comprises rocks containing phyllosilicates.

5. The electret of claim 4 wherein said rocks are selected from rocks having a foliated, gneissic or schistose structure or fabric; and slates and phyllites with major cleavage planes.

6. The electret of claim 2 wherein said material comprises man-made materials fabricated with clay minerals.

7. The electret of claim 6 wherein said man-made materials are selected from paper products and ceramic tiles.

8. A method of fabricating an electret comprising the step of modifying at least one surface of an inherently charged phyllosilicate material by either moving external neutralizing ions therefrom or adding external neutralizing ions thereto.

9. The method of claim 8 including the steps of:
(a) placing said material between a pair of electrodes;
(b) immersing the material and the electrodes in an electrically insulating medium;
(c) applying a dc potential across the electrodes to create an electrical field across the material, the duration of application of the dc potential being sufficient to provide a large surface charge on the material;
(d) separating the material from the electrodes while still immersing the material in said medium and still applying an electric field across said material; and (e) removing the material from said medium to obtain a substantially permanently charged electret.

10. The method of claim 8 wherein the material is separated into layers along its natural cleavage planes.

11. The method of claim 8 wherein said electric field is in the order of 200,000 up to 1,000,000 volts/cm.

12. The method of claim 8 wherein said phyllosilicate minerals include minerals of igneous, metamorphic, sedimentary, weathering, and artificially synthesized origins.

13. The method of claim 8 wherein said minerals include micas selected from the group comprising muscovite, biotite, phlogopite, and lepidolite; vermiculite; chorites; brittle micas; kaolinite; nacrite; dickite; serpentine minerals; and smectite clay minerals.

14. The method of claim 8 wherein said material comprises rocks containing phyllosilicates.

15. The method of claim 14 wherein said rocks are selected from rocks having foliated, gneissic or schistose structures or fabrics; and slates and phyllites with major cleavage planes.

16. The method of claim 8 wherein said material comprises man-made materials fabricated with clay minerals.

17. The method of claim 16 wherein said man-made materials are selected from paper products and ceramic tiles.

18. The method of claim 8 wherein said insulating medium is selected from high voltage transformer oil and high-voltage insulating gas.

19. The method of claim 8 wherein said electric field is applied for 10 minutes.

* * * * *